United States Patent
Verner et al.

(10) Patent No.: US 7,918,265 B2
(45) Date of Patent: Apr. 5, 2011

(54) METHOD AND APPARATUS FOR AS-CAST SEAL ON TURBINE BLADES

(75) Inventors: Carl R. Verner, Windsor, CT (US);
Steven J. Bullied, Pomfret Center, CT (US)

(73) Assignee: United Technologies Corporation, Hartford, CT (US)

( * ) Notice: Subject to any disclaimer, the term of this patent is extended or adjusted under 35 U.S.C. 154(b) by 629 days.

(21) Appl. No.: 12/069,998

(22) Filed: Feb. 14, 2008

(65) Prior Publication Data

US 2009/0208769 A1 Aug. 20, 2009

(51) Int. Cl.
*B22C 9/04* (2006.01)
*B22D 27/04* (2006.01)

(52) U.S. Cl. ............... 164/516; 164/122.2; 164/361
(58) Field of Classification Search .......... 164/516–519, 164/122.2, 361
See application file for complete search history.

(56) References Cited

U.S. PATENT DOCUMENTS

| | | | |
|---|---|---|---|
| 3,853,425 A | 12/1974 | Scalzo et al. | |
| 3,981,344 A | 9/1976 | Hayes et al. | |
| 4,062,638 A | 12/1977 | Hall, Jr. | |
| 4,116,723 A | 9/1978 | Gell et al. | |
| 4,469,160 A | 9/1984 | Giamei | |
| 4,813,470 A | 3/1989 | Chiang | |
| 5,062,469 A * | 11/1991 | Monte et al. | 164/122.2 |
| 5,295,530 A | 3/1994 | O'Connor et al. | |
| 5,489,194 A * | 2/1996 | Yoshinari et al. | 416/241 R |
| 5,967,745 A | 10/1999 | Tomita et al. | |
| 6,984,112 B2 | 1/2006 | Zhang et al. | |
| 7,121,800 B2 * | 10/2006 | Beattie | 416/190 |
| 7,231,955 B1 | 6/2007 | Bullied et al. | |
| 7,264,036 B2 * | 9/2007 | Chang et al. | 164/45 |
| 2005/0186074 A1 | 8/2005 | Tomita et al. | |
| 2006/0275106 A1 | 12/2006 | Alvanos et al. | |
| 2006/0275107 A1 | 12/2006 | Alvanos et al. | |
| 2006/0275108 A1 | 12/2006 | Memmen et al. | |
| 2007/0098545 A1 | 5/2007 | Alvanos et al. | |
| 2008/0263863 A1 * | 10/2008 | Rose | 29/889.1 |

FOREIGN PATENT DOCUMENTS

| | | | |
|---|---|---|---|
| EP | 179649 | * | 4/1986 |
| EP | 1 510 271 A2 | | 3/2005 |
| EP | 1 764 484 A2 | | 3/2007 |
| GB | 2 010 404 A | | 6/1979 |
| GB | 2194000 | * | 2/1988 |
| GB | 2 307 520 A | | 5/1997 |

OTHER PUBLICATIONS

Official Search Report and Written Opinion of the European Patent Office in counterpart foreign Application No. 09250238.4 filed Jan. 29, 2009.

* cited by examiner

*Primary Examiner* — Kuang Lin
(74) *Attorney, Agent, or Firm* — Kinney & Lange, P.A.

(57) ABSTRACT

An investment casting mold article includes a wall for retaining casting material and a cavity defined by the wall. The cavity includes an airfoil portion, a root portion adjacent to the airfoil portion, and a labyrinth seal portion extending from the root portion.

11 Claims, 4 Drawing Sheets

METHOD AND APPARATUS FOR AS-CAST SEAL ON TURBINE BLADES

BACKGROUND

The present invention relates to a method and apparatus for producing turbine single-crystal gas turbine engine components having integral sealing structures.

Gas turbine engines include a number of blades and vanes that interact with fluids moving through these engines. There is a need to provide seals that limit fluid flow out of designated areas, and such sealing is particularly important in a hot section of a gas turbine engine where the escape of hot fluids can damage engine components and cause reduced engine performance. In the past, seals such a stand-alone labyrinth seal disks have been attached to rotor disks carrying turbine blades, using bolts or other means. These labyrinth seal disks can provide air seals between the rotating structures associated with the blades and adjacent non-rotating structures, which typically include a non-rotating abradable seal structure positioned in close proximity to outwardly extending portions of the rotating labyrinth seal disk. More recently, it has been desired to provide labyrinth sealing structures such as knife edges and hammerhead structures that extend directly from a root portion of turbine blades. In other words, rather than providing separate seal structures, the seal structures are integrated directly into the blade. Examples of such integrated seal structures are disclosed in published United States patent applications US2006/0275106A1, entitled BLADE NECK FLUID SEAL; US2006/0275107A1, entitled COMBINED BLADE ATTACHMENT AND DISK LUG FLUID SEAL; US2006/0275108A1, entitled HAMMERHEAD FLUID SEAL; and US2007/0098545A1, entitled INTEGRATED BLADED FLUID SEAL, each being assigned to the Assignee of the present application.

The manufacture of labyrinth sealing structures such as knife edges and hammerheads that extend outward from root portions of turbine blades presents a number of problems. The blade can be cast in a rough, relatively imprecise manner and then machined to desired shapes and dimensions with precision, forming the labyrinth sealing structures solely by way of the machining process. However, it is generally desirable to reduce machining work as much as possible to make manufacture easier and to reduce material costs. Moreover, the configuration of typical turbine blades can make machining of labyrinth sealing structures difficult or impossible, or can undesirably limit design options for the labyrinth sealing structures. For example, a platform of a turbine blade can extend outward in such a way that machining tools cannot be maneuvered to form desired labyrinth sealing structures located in close proximity to the platform, due to obstruction by the platform.

Furthermore, conventional casting methods would generally not produce as-cast structures with sufficient dimension and true position tolerances for labyrinth sealing structures such as knife edges and hammerhead structures, which must align with adjacent structures in order to properly function in an engine. Conventional casting is also problematic because blades having single-crystal grain structures, as are commonly used in hot sections of modern gas turbine engines, will not allow the growth of the single crystal grain structure through relatively complex, long and slender structures like knife edges and hammerhead structures. Also, turbine blades are normally cast in a tip-down orientation, and in that the orientation of labyrinth sealing structures generally requires grain growth in a sideways or downward direction during solidification of the casting material, which is not feasible for single-crystal growth.

SUMMARY

An investment casting mold article includes a wall for retaining casting material and a cavity defined by the wall. The cavity includes an airfoil portion, a root portion adjacent to the airfoil portion, and a labyrinth seal portion extending from the root portion.

DETAILED DESCRIPTION

In general, the present invention provides an apparatus and method for producing single-crystal turbine blades through investment casting such that the blades are substantially in a finished state as-cast. These as-cast turbine blades can include sealing structures such as knife edges and hammerheads that are relatively long and slender and extend outward from a root portion of the blade. In some embodiments, grain jumpers are used to help promote a single-crystal grain structure through the sealing structures. Furthermore, in some embodiments gussets and/or strongback cores are used in an investment casting mold to promote dimensional stability and maintain true position of features of as-cast blades. By providing blades with features defined substantially as-cast, post-casting machining requirements and raw materials can be reduced.

Figure 1:
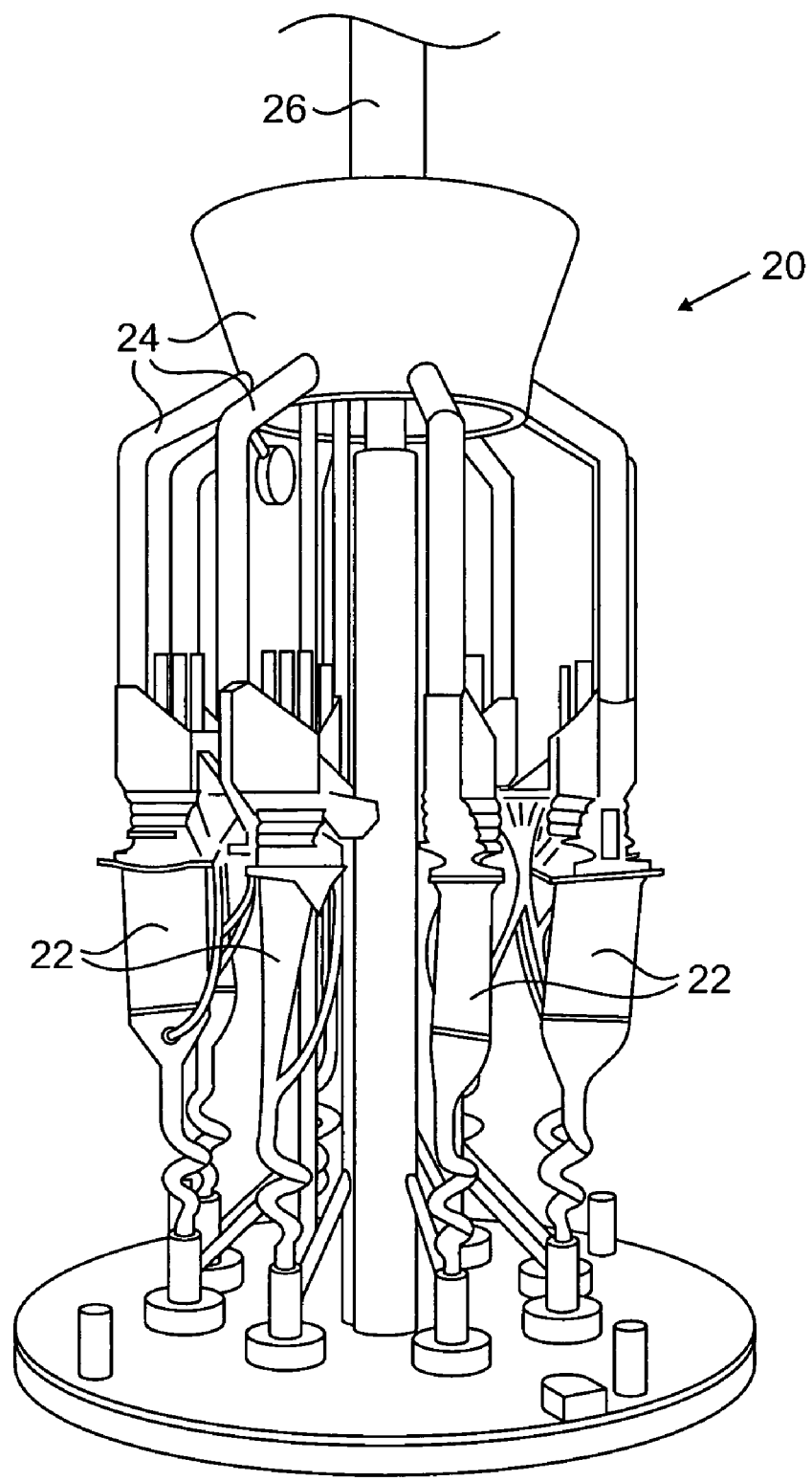
FIG. 1 is a perspective view of an investment casting mold assembly according to an embodiment of the present invention.

FIG. 1 is a perspective view of an exemplary embodiment of an investment casting mold assembly 20 that includes eight individual turbine blade investment casting molds 22 connected to a common alloy feed gate subassembly 24 and a support jig 26. It should be understood that the number of individual investment casting molds 22 in the assembly 20 can vary as desired, and the configuration of the assembly 20 can vary as desired for particular applications. The molds 22 constitute walls for retaining casting material within one or more cavities defined within those walls as those familiar with investment casting will readily appreciate. Examples of resultant turbine blade shapes with labyrinth seal structures (e.g., knife edges and hammerheads) produced with the molds 22 are disclosed in commonly-assigned U.S. Pat. App. Pub. Nos. 2006/0275106A1, 2006/0275107A1, 2006/0275108A1, and 2007/0098545A1.

Figure 2:
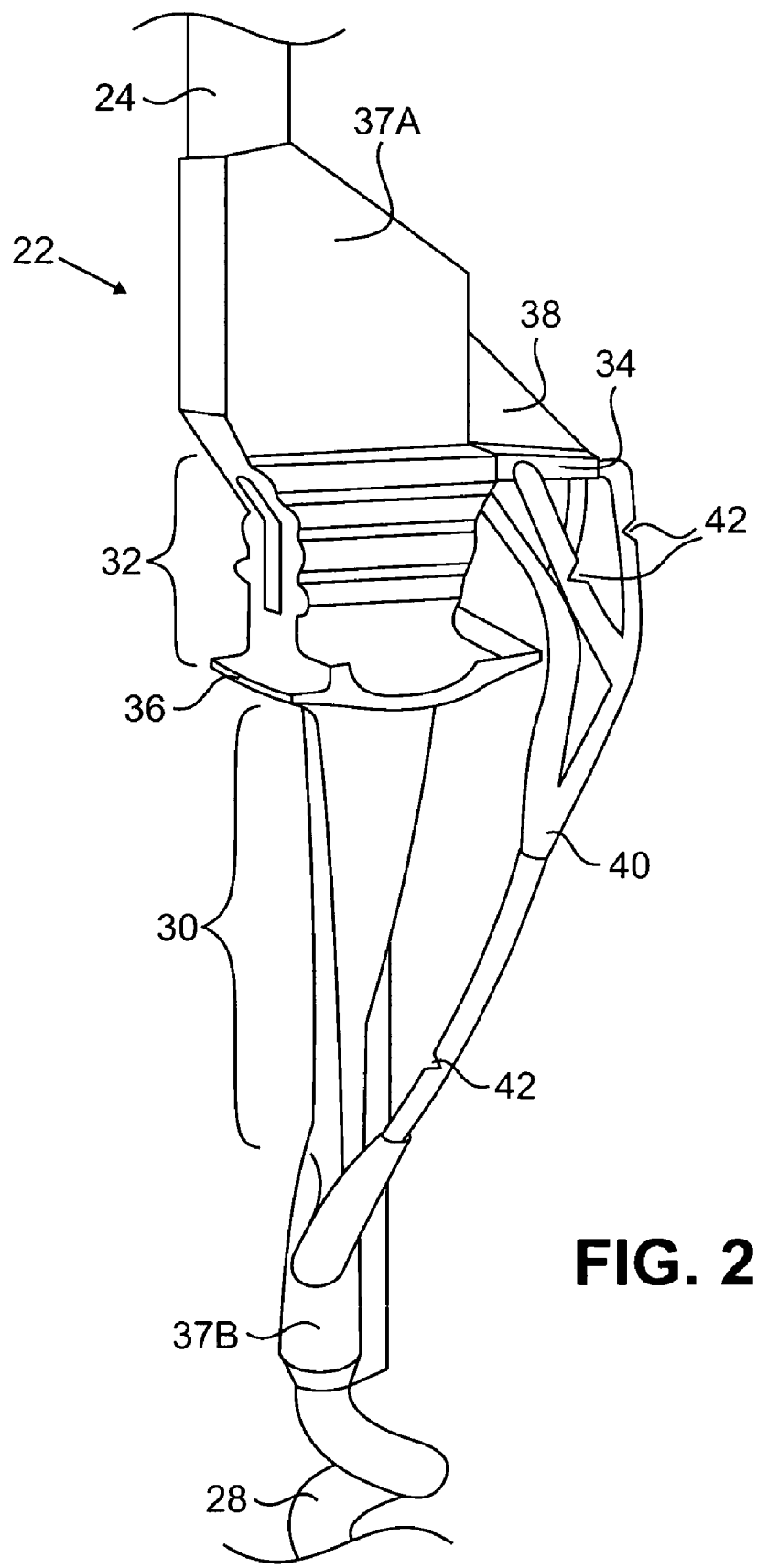
FIG. 2 is a perspective view of a portion of the investment casting mold assembly of FIG. 1.

FIG. 2 is a perspective view of one of the individual turbine blade investment casting molds 22 of the investment casting mold assembly 20. The other individual turbine blade investment casting molds 22 of the assembly 20 can be configured substantially the same as that one illustrated in FIG. 2. Each mold 22 includes a grain-selection structure 28, an airfoil portion 30, a root portion 32, and a labyrinth seal portion 34 extending from a leading edge side of the root portion 32. In the illustrated embodiment, the mold 22 also includes a platform portion 36 located between the airfoil portion 30 and the root portion 32, stock portions 37A and 37B, as well as a gusset portion 38 extending from the labyrinth seal portion 34. One or more grain jumpers 40 having notches 42 therein are connected from the stock portion 37B near the grain selection structure 28 to the labyrinth seal portion 34.

The grain selection structure 28 can be a conventional helical tube structure or "pig-tail" that encourages growth of a uniform "single crystal" crystallographic grain structure orientation of metallic material in the mold during solidification from a molten state. The grain selection structure 28 is generally located at the bottom of the mold 22, and would be the first portion of the mold 22 cooling during solidification, as explained further below.

The airfoil portion 30 is used to define a thin, aerodynamically shaped airfoil of a blade produced with the mold 22. The root portion 32 can include a dovetail, firtree, or other blade retention structure, and in alternative embodiments can include an optional radially-extending shank portion (not shown). The platform portion 36 defines a radially-inward gas path boundary of the blade produced with the mold 22.

The stock portions 37A and 37B result in additional material being cast with the desired turbine blade shape. These stock portions 37A and 38B aid casting material feeding into the mold 22 and aid single-crystal grain growth. In addition, stock can be added to a trailing edge side of the root portion 32, to pressure and suction sides of the labyrinth seal portion 34 at a depth of 0.127 mm (0.005 inch), and to other desired locations to aid grain growth. After casting, material formed at these stock portions can be removed by machining. Material removal at these locations is relatively simple, because these stock portions are arranged along the cast turbine blade where machining tooling is not obstructed by protruding blade features, and the machining tooling does not need to form complex shapes requiring great accuracy.

The gusset 38 can be formed in a generally triangular shape of approximately 1.27 mm (0.050 inch) in thickness, connecting the labyrinth seal portion 34 and the root portion 32. The gusset 38 helps aid casting material feeding into the mold 22 and promote dimensional and true position stability to the labyrinth seal portion 34 during casting material solidification.

The grain jumpers 40 are tube-like gates that can be connected between different portions of the mold 22 to promote desired single-crystal grain structure growth. It is known that single-crystal grain structure growth is impeded with relatively small, elongated portions of a mold extending in a downward direction (relative to the orientation of the mold assembly during solidification), because those downwardly-extending portions can solidify independent of material in other portions of the mold and can thereby undesirably produce grain structures other than single-crystal grain structures. In order to reduce such difficulties, the grain jumpers 40 are positioned to provide generally vertically-oriented paths of molten material that extend to the generally downwardly-oriented regions of the labyrinth seal portion 34. The grain jumpers 40 can also connect to the platform portion 36 of the mold 22, as shown in the embodiment in FIG. 3.

During the casting process, the solidification of material within the grain jumpers 40 could exert stress upon the labyrinth seal portion 34 and undesirably alter the true position of one or more features of the labyrinth seal portion 34. Tolerances of the labyrinth seal portion 34 are relatively tight, with design tolerances of plus or minus 0.0508 mm (0.002 inch) for the true position of tips of labyrinth seals features formed by the labyrinth seal portion 34. In order to discourage such undesired alteration of true position, notches 42 can be formed in the grain jumpers 40 to encourage solidifying material to break apart along the length of the grain jumpers 40 rather than exert pressure on the labyrinth seal portion 34.

Figure 3:
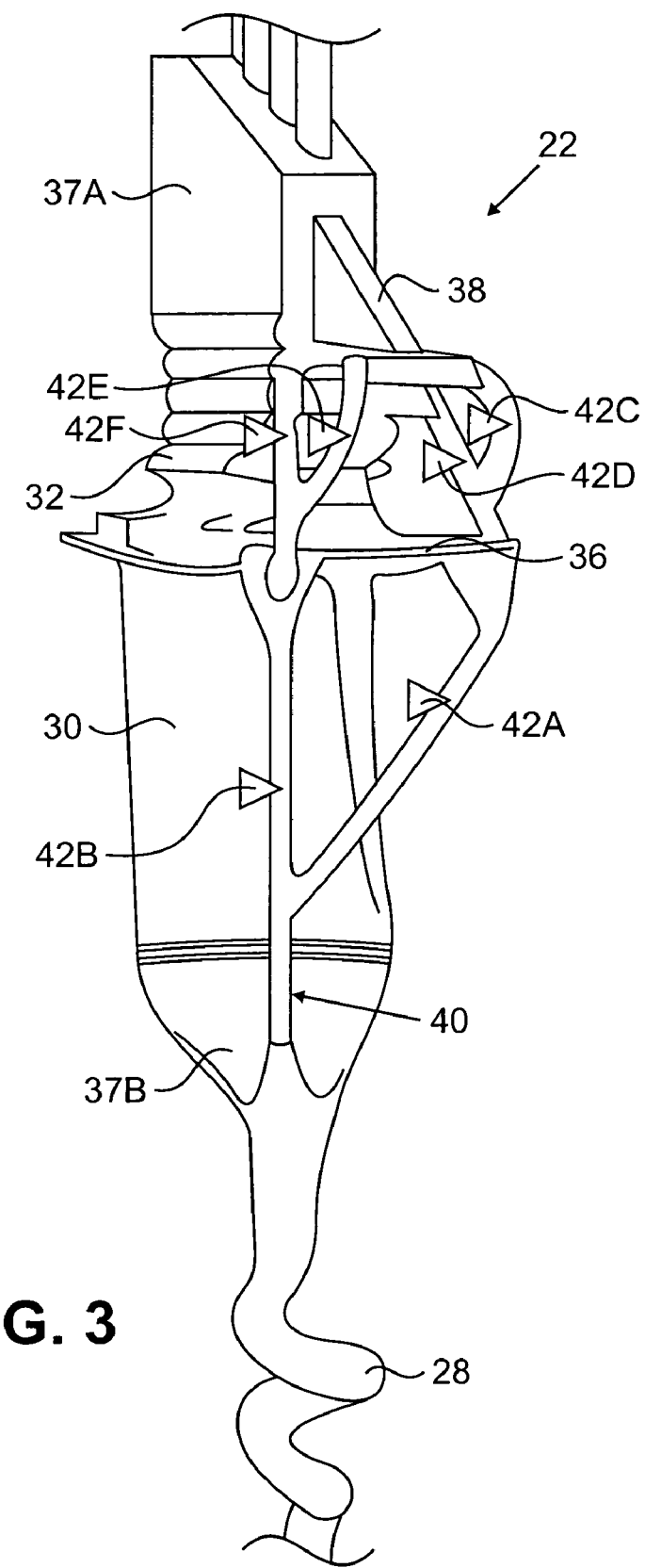
FIG. 3 is a perspective view of the portion of the investment casting mold assembly of FIG. 2, with indications of possible grain jumper notch locations.

FIG. 3 is a perspective view of one investment casting mold 22, with indications of exemplary locations 42A-42F for the notches 42 in the grain jumpers 40. It is generally desired that notches be provided between any two connection points of the grain jumpers 40 and along each branch of the grain jumpers 40. For instance, notch locations 42A and 42B are present on each grain jumper 40 branch between the stock portion 37B and the platform portion 36, and notch locations 42C-42F are present on each grain jumper 40 branch between the platform portion 36 and the labyrinth seal portion 34. Preferably, the notch locations 42A-42F are at approximately 50% span between attachment points of the grain jumpers 40. However, it should be recognized that location, positioning and configuration of the grain jumpers 40 and the notches 42 can vary as desired for particular applications.

The investment casting mold 22 can be fabricated to a desired shape and configuration using, for example, conventional lost-wax materials and techniques that are well-known in the art. Ceramic cores embedded in the wax can optionally be utilized to produce internal cavities or passageways in the resultant turbine blade, in a known manner. The grain jumpers 40 can be manually formed by connecting elongate wax strands between desired locations and forming the notches 42 therein using a hot blade prior to coating the wax with the mold material. These notches 42 in the mold 22 then encourage solidifying material in the molds 22 to break apart at the notch locations 42A-42F without introducing stresses in the labyrinth seal portion 34.

Once the mold assembly 20 is assembled, the casting process can proceed as follows. A molten metallic material, such as a nickel- or cobalt-based superalloy, can be introduced to the hollow mold assembly 20 via the gate subassembly 24, which distributes the molten material to each of the individual turbine blade molds 22. Then, solidification of the molten material in the molds 22 is initiated, for instance, by slowly lowering the support jig 26 of the mold assembly 20 vertically out of a furnace such that solidification occurs along generally horizontal solidification line. Solidification occurs through the grain selection structure 28 first, to select single-crystal grain structure that will essentially be uniform across the entire resultant casting.

The resultant cast turbine blade will have features that have dimensions as true positions that are in a final state as cast to within a tolerance of about plus or minus 0.0762 mm (0.003 inch). To the extent that the gusset 38 and grain jumpers 40 may exert some consistent drift in true position during solidification, the configuration of the molds 22 can be adjusted such that the desired final true position is achieved after solidification taking into account true position drift.

Figure 4:
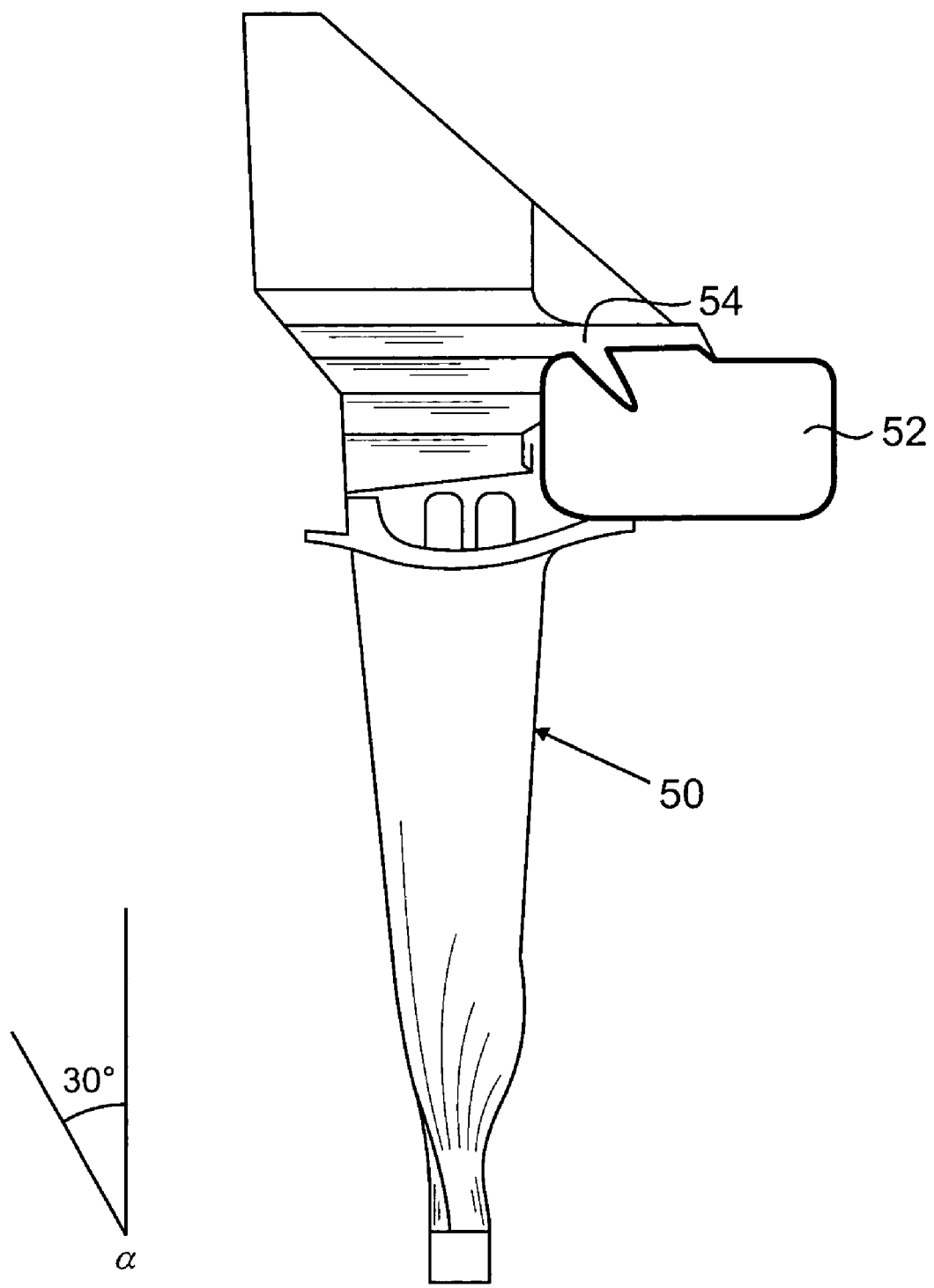
FIG. 4 is a side view of a wax investment casting form according to the present invention utilizing a strongback core.

FIG. 4 is a side view of a wax investment casting form 50 utilizing a strongback core 52. The wax investment casting form 50 is a die-cast wax article that is coated to form the investment casting molds 22 described above. However, in the embodiment shown in FIG. 4, the strongback core 52 is positioned immediately adjacent to a labyrinth seal structure 54, which defines the labyrinth seal portion 34 of the mold 22. The strongback core 52 can be a ceramic article made of a material similar to ceramic core inserts for defining internal cavities during investment casting that has a shape that corresponds to the shape of the labyrinth seal structure 54. During fabrication of the molds 22, the strongback core 52 can be inserted into the wax die, and the wax material of the form 50 cast around the strongback core 52. After the molds 22 are formed, the strongback core 52 remains in place during casting and provides a relatively rigid support that helps to maintain the dimensional and true position stability of adjacent features of during solidification. Molds 22 that utilize the strongback core 52 can be used with or without grain jumpers 40, in alternative embodiments.

In one embodiment, the grain jumpers 40 can be omitted and the individual investment casting molds 22 positioned at an angle α, e.g., approximately 30° from vertical, such that single-crystal grain structure growth is encouraged through the labyrinth seal portions 34 of the molds 22 (corresponding to the labyrinth seal structure 54 of the wax form 50). Alternatively, the molds 22 could be arranged in a "tip-up" orientation with the airfoil portion 30 arranged on top of the root portion 32 to obviate the need to the grain jumpers 40.

It should be recognized that the investment casting apparatus and method described above provides numerous advantages. For instance, by allowing turbine blade features such as labyrinth seal structures to be formed as-cast, post-casting machining requirements can be reduced to limit manufacturing time and expense. Moreover, the ability to provide as-cast feature on a turbine blade expands the flexibility of turbine blade design, and can eliminate the problem of the blade platform obstructing access to machine a labyrinth seal structure extending from the blade root.

Although the present invention has been described with reference to preferred embodiments, workers skilled in the art will recognize that changes may be made in form and detail without departing from the spirit and scope of the invention.

The invention claimed is:

1. An investment casting mold article comprising:
   a wall for retaining casting material;
   a cavity defined by the wall, the cavity comprising:
      an airfoil portion;
      a root portion adjacent to the airfoil portion;
      a labyrinth seal portion extending from the root portion; and
      an extension portion extending from the airfoil portion, wherein the extension portion is configured to select a single crystal grain structure during casting when solidification begins at the extension portion;
   a grain jumper gate connected between the extension portion and the labyrinth seal portion for facilitating single crystal grain structure through the labyrinth seal portion during casting; and
   a notch formed along the grain jumper gate to encourage material within the grain jumper gate to break apart during casting to mitigate stress at the labyrinth seal portion.

2. The article of claim 1 and further comprising:
   a gusset portion extending from the labyrinth seal portion for increasing dimensional stability of the labyrinth seal portion during casting.

3. The article of claim 2, wherein the gusset portion connects the labyrinth seal portion and the root portion and faces away from the airfoil portion.

4. The article of claim 1 and further comprising:
   a strongback core positioned immediately adjacent to at least part of the labyrinth seal portion of the cavity.

5. The article of claim 1 and further comprising:
   a platform portion located where the airfoil portion meets the root portion, wherein the grain jumper gate connects to both the platform portion and the labyrinth seal portion.

6. A method of casting a gas turbine engine component, the method comprising:
   providing an investment casting mold having a cavity with an airfoil portion, a root portion adjacent to the airfoil portion, and a labyrinth seal portion extending from the root portion;
   connecting a grain jumper gate to the labyrinth seal portion of the cavity of the investment casting mold to influence crystallographic orientation of the metallic casting material;
   forming a notch along the grain jumper gate to encourage the metallic casting material in the grain jumper gate to break apart during solidification;
   supplying the metallic casting material to the cavity of the investment casting mold;
   solidifying the metallic casting material to form the gas turbine engine component with a single crystal grain structure, wherein a first feature of the gas turbine engine component defined by the labyrinth seal portion of the investment casting mold has a dimension and a true position defined as-cast.

7. The method of claim 6, wherein the cavity of the investment casting mold further comprises a gusset portion extending from the labyrinth seal portion, the method further comprising:
   controlling dimensional stability of at least a portion of the metallic casting material supplied to the labyrinth seal portion using the gusset portion.

8. The method of claim 7 and further comprising:
   removing any metallic casting material having solidified within the gusset portion of the investment casting mold.

9. The method of claim 6 and further comprising:
   positioning a strongback core immediately adjacent to at least part of the labyrinth seal portion of the cavity of the investment casting mold at a location where the first feature is formed.

10. The method of claim 6 and further comprising:
    positioning the investment casting mold such that the tip portion of the cavity is oriented substantially upward for solidification of the metallic casting material.

11. The method of claim 6 and further comprising:
    machining the metallic casting material that solidified within the root portion of the investment casting mold to form a fir tree structure, wherein excess metallic casting material that solidified adjacent to the first feature of the gas turbine engine component defined by the labyrinth seal portion of the investment casting mold is removed while machining the fir tree structure.

\* \* \* \* \*

UNITED STATES PATENT AND TRADEMARK OFFICE
CERTIFICATE OF CORRECTION

| | | |
|---|---|---|
| PATENT NO. | : 7,918,265 B2 | Page 1 of 1 |
| APPLICATION NO. | : 12/069998 | |
| DATED | : April 5, 2011 | |
| INVENTOR(S) | : Carl R. Verner and Steven J. Bullied | |

It is certified that error appears in the above-identified patent and that said Letters Patent is hereby corrected as shown below:

Col. 6, Line 16
  Delete "the"
  Insert --a--

Signed and Sealed this
Fourteenth Day of June, 2011

David J. Kappos
*Director of the United States Patent and Trademark Office*